(12) United States Patent
Chen et al.

(10) Patent No.: US 8,610,161 B2
(45) Date of Patent: Dec. 17, 2013

(54) LIGHT EMITTING DIODE OPTICAL EMITTER WITH TRANSPARENT ELECTRICAL CONNECTORS

(75) Inventors: Yung-Chang Chen, Hsinchu (TW); Hsin-Hsien Wu, Hsinchu (TW); Ming Shing Lee, Zhudong Township (TW); Huai-En Lai, Fengshan (TW); Fu-Wen Liu, Hsinchu (TW); Andy Wu, Zhubei (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 143 days.

(21) Appl. No.: 13/253,797

(22) Filed: Oct. 5, 2011

(65) Prior Publication Data
US 2012/0104450 A1    May 3, 2012

Related U.S. Application Data

(60) Provisional application No. 61/407,549, filed on Oct. 28, 2010.

(51) Int. Cl.
*H01L 33/42* (2010.01)
(52) U.S. Cl.
USPC ............. 257/99; 257/100; 257/678; 257/698; 438/28
(58) Field of Classification Search
CPC ....................................................... H01I 33/42
USPC ............ 257/E33.064, E33.058, 13, E33.008, 257/E33.066, E33.056, E33.062, 79, 99, 257/100, 678, 698; 428/28; 438/28
See application file for complete search history.

(56) References Cited

U.S. PATENT DOCUMENTS

| | | | |
|---|---|---|---|
| 6,903,374 B2 | 6/2005 | Katayama | |
| 6,919,063 B2 * | 7/2005 | Jang et al. | 423/445 B |
| 7,256,483 B2 * | 8/2007 | Epler et al. | 257/676 |
| 7,405,431 B2 * | 7/2008 | Aoyagi et al. | 257/79 |
| 7,474,282 B2 * | 1/2009 | Okamoto | 345/76 |
| 7,573,074 B2 | 8/2009 | Shum et al. | |
| 2003/0146445 A1 * | 8/2003 | Hen | 257/93 |
| 2005/0179042 A1 * | 8/2005 | Yang et al. | 257/84 |
| 2006/0157714 A1 * | 7/2006 | Yoo et al. | 257/79 |
| 2007/0170450 A1 * | 7/2007 | Murphy | 257/99 |
| 2007/0210317 A1 * | 9/2007 | Chou et al. | 257/79 |
| 2008/0074029 A1 | 3/2008 | Suehiro | |
| 2008/0121899 A1 | 5/2008 | Pires et al. | |
| 2008/0128731 A1 * | 6/2008 | DenBaars et al. | 257/98 |
| 2008/0149949 A1 * | 6/2008 | Nakamura et al. | 257/89 |

* cited by examiner

*Primary Examiner* — Stephen W Smoot
*Assistant Examiner* — Pavel Ivanov
(74) *Attorney, Agent, or Firm* — Haynes and Boone, LLP

(57) ABSTRACT

An optical emitter includes a Light-Emitting Diode (LED) on a package wafer, transparent insulators, and one or more transparent electrical connectors between the LED die and one or more contact pads on the packaging wafer. The transparent insulators are deposited on the package wafer with LED dies attached using a lithography or a screen printing method. The transparent electrical connectors are deposited using physical vapor deposition, chemical vapor deposition, spin coating, spray coating, or screen printing and may be patterned using a lithography process and etching.

22 Claims, 8 Drawing Sheets

LIGHT EMITTING DIODE OPTICAL EMITTER WITH TRANSPARENT ELECTRICAL CONNECTORS

CROSS-REFERENCE TO RELATED APPLICATIONS

The present application claims priority of U.S. Provisional Patent Application Ser. No. 61/407,549, filed on Oct. 28, 2010, which is incorporated herein by reference in its entirety.

FIELD

The present disclosure relates generally to a semiconductor light source and, more particularly, to a light-emitting diode (LED).

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doped semiconductor compound layers. Different wavelengths of light can be generated by varying the bandgaps of the semiconductor layers (accomplished by, e.g., using different materials) and by fabricating an active layer (explained further below in the specification) within the p-n junction. Additionally, an optional phosphor material changes the properties of light generated by the LED.

Traditionally, LEDs are made by growing a plurality of light-emitting structures on a growth substrate. The light-emitting structures along with the underlying growth substrate are separated into individual LED dies. At some point before or after the separation, electrodes or metal pads are added to each of the LED dies to allow the conduction of electricity across the structure. LED dies are then packaged by adding a package substrate, bonding wires, a reflector, phosphor material, and/or lens to become an optical emitter.

Continued development in LEDs has resulted in light sources that can cover the visible spectrum and beyond. These attributes, coupled with the potentially long service life of solid state devices, may enable a variety of new display applications, and may place LEDs in a position to compete with the well entrenched incandescent and fluorescent lamps.

However, improvements in manufacturing processes to make highly efficient and mechanically robust LEDs continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
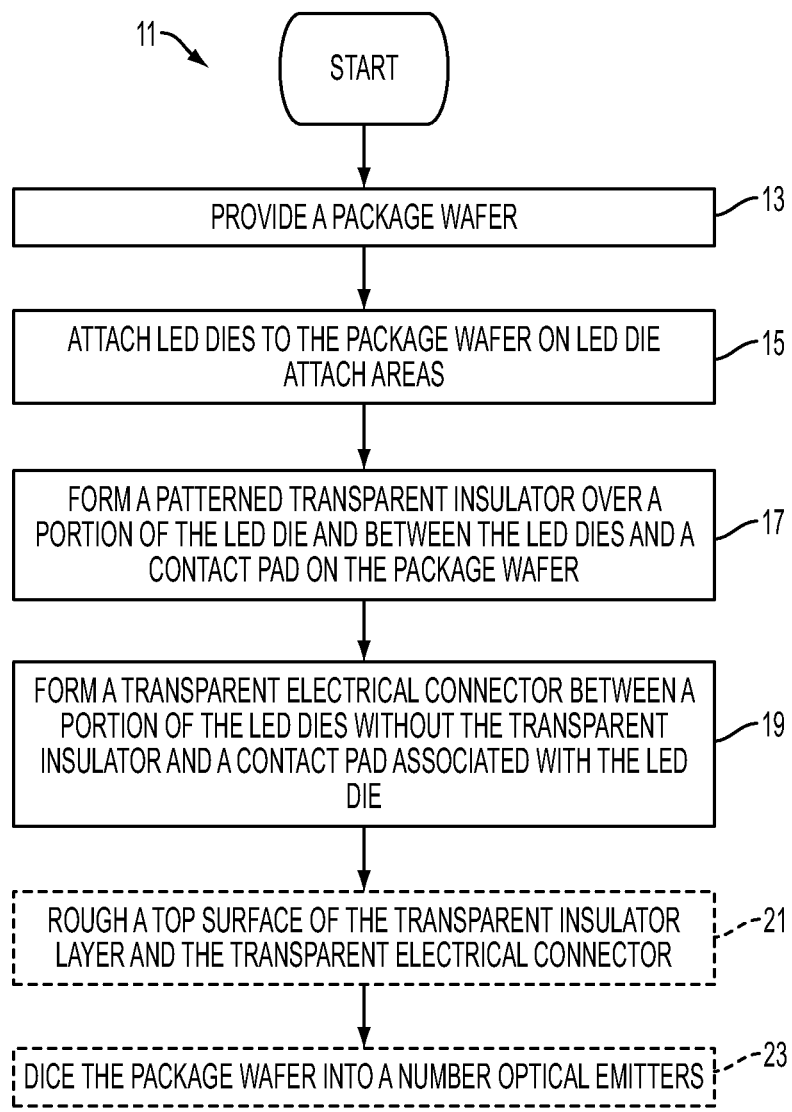
FIG. 1 is a flowchart illustrating a method of fabricating an optical emitter according to an embodiment of the present disclosure.

One aspect of the present disclosure involves an optical emitter including a Light-Emitting Diode (LED) die, a package wafer attached to one side of the LED die, one or more transparent electrical connectors connecting the LED die and at least a contact pad on the package wafer, and a transparent insulator under at least a portion of the transparent electrical connector. In some embodiments, the optical emitter also includes a Zener diode connected by a transparent electrical connector to the LED die.

Another aspect of the present disclosure involves a method for forming a plurality of optical emitters on a package wafer. A package wafer is provided that includes a plurality of Light-Emitting Diode (LED) die attach areas and a plurality of contact pads, wherein each LED die attach area is associated with at least one contact pad. The LED dies are attached to the package wafer at the LED die attach areas. The transparent insulators are deposited on the package wafer with LED dies attached using a lithography or a screen printing method. The transparent electrical connectors are deposited using physical vapor deposition, chemical vapor deposition, spin coating, spray coating, or screen printing and may be patterned using a lithography process and etching.

These and other features of the present disclosure are discussed below with reference to the associated drawings.

DETAILED DESCRIPTION

It is understood that the following disclosure provides many different embodiments, or examples, for implementing different features of various embodiments. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that various figures have been simplified for a better understanding of the inventive concepts of the present disclosure. Accordingly, it should be noted that additional processes may be provided before, during, and after the methods described in flowcharts, that some other processes may only be briefly described, and various processes may be substituted for the described processes to achieve the same effect.

An optical emitter includes an LED die attached to a package substrate and optional phosphor material coating over the LED die or dispersed in encapsulant or lens material. An LED package substrate is usually a lead frame, ceramic, or an alumina board. The LED die may be electrically connected to circuitry on the package substrate in a number of ways. One connection method involves attaching a growth substrate side of the die to the package substrate, and forming metal electrode pads that are connected to the p-type semiconductor layer and the n-type semiconductor layer in a light-emitting structure on the die, and then bond wiring from the metal electrode pads to contact pads on the package substrate. Another connection method involves inverting the LED die and using solder bumps to connect the electrode pads on the light-emitting structure directly to the package substrate. The light from the LED is then directed through the growth substrate. Yet another connection method involves using hybrid connectors. One semiconductor layer, for example the p-type layer, may be wired bonded from a metal electrode pad to a contact pad on the package substrate while the other layer (n-type layer) may be soldered to a contact pad on the package substrate.

An optical emitter may be a part of a display or lighting device. In some configurations, an optical emitter has one or more Light-Emitting Diodes (LEDs), and the LEDs are either controlled individually or collectively. The optical emitter may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors.

A LED die emits light in all directions; however, as a light source, the optical emitter outputs light only on one side. Thus, an objective of a designer is to redirect as much of the light emitted in all directions toward a predetermined light-emitting direction. Further, as much light as possible is extracted from the die which has a much higher refractive index than a lower-index surrounding. Any light that is not properly directed and extracted may be absorbed and become heat that also needs to be removed. Balanced against light extraction and direction considerations are objectives to have good electrical and thermal conduction. In some configurations, the package includes one or more metal electrode pads and wires in the light path on the output side, which can reduce light extraction by blocking and reflecting the light. For example, a package using metal wires and metal electrodes, which do not transmit any light, can reduced have light output by as much as 20%. In efforts to increase light extraction, smaller metal electrode pads have been used, with the concomitant effect of reducing the reliability of the electrical connection and making the wire bonding operation more difficult. Thinner wires has higher electrical resistance. Wire bonding requires certain electrode pads to have at least a certain thickness. To increase the reliability, a transparent current spreader layer has also been added above the LED die and below the electrode. However, the light blocking/shielding remains an issue because a metal electrode is required to make a wire bond connection.

An optical emitter in accordance with various embodiments of the present disclosure uses transparent electrical connectors instead of the metal wire and metal electrode to obtain higher LED light output. The optical emitter includes a Light-Emitting Diode (LED) die, a package wafer attached to one side of the LED die, one or more transparent electrical connectors connecting the LED die and at least a contact pad on the package wafer, and a transparent electrical insulator under at least a portion of the transparent electrical connector. As a result, the light path from the LED surface is not blocked by any opaque and reflective material such as metal wires and metal electrodes as it exits the optical emitter.

Two major types of LED dies are the vertical LED die and the horizontal LED die. The main difference between them concerns the direction of current flow and removal of the growth substrate. In a vertical LED die, the current flows substantially vertically from one side to another across the p-n junction through electrodes located on opposite sides of the die. Because the growth substrate is not conductive, it is removed before the LED dies are attached to the package wafer. Then one side of the LED die is bonded and electrically connected to a LED die attach area on the package wafer. In this case the attaching may be accomplished using soldering, metal bonding such as eutectic bonding, or gluing using a conductive glue. The other side of a vertical LED die may have one or more wire bonds to the package substrate. For a horizontal LED, the electrical connections for both the p junction and the n junction are made on the same side of the LED die, usually through wire bonding.

Figure 3A:
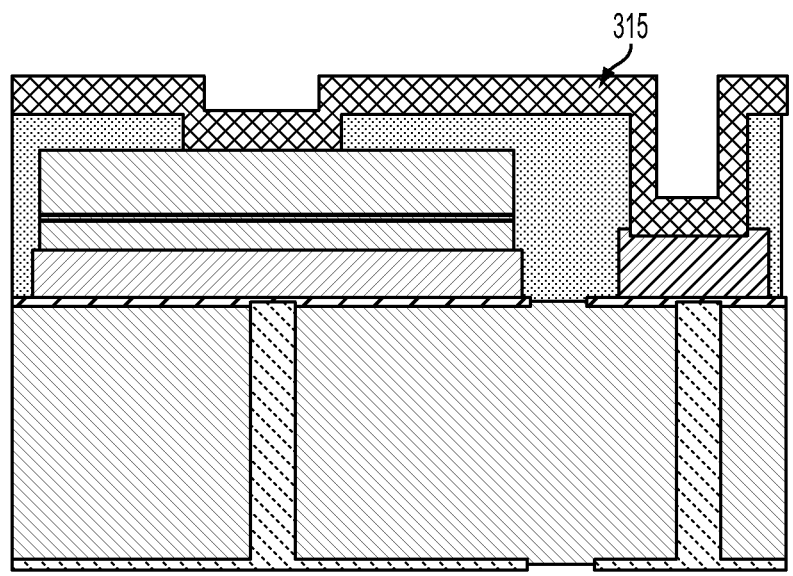
Figure 3B:
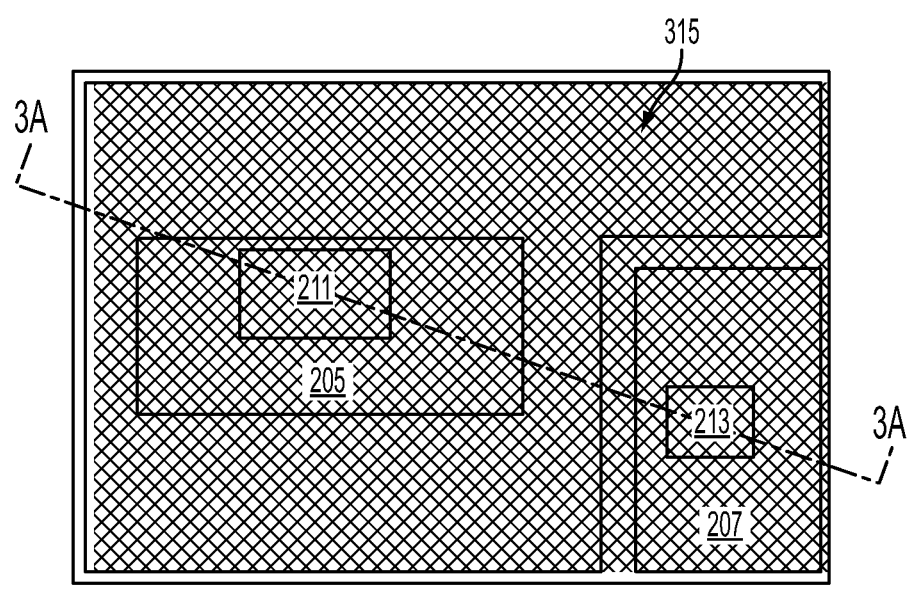
Figure 4:
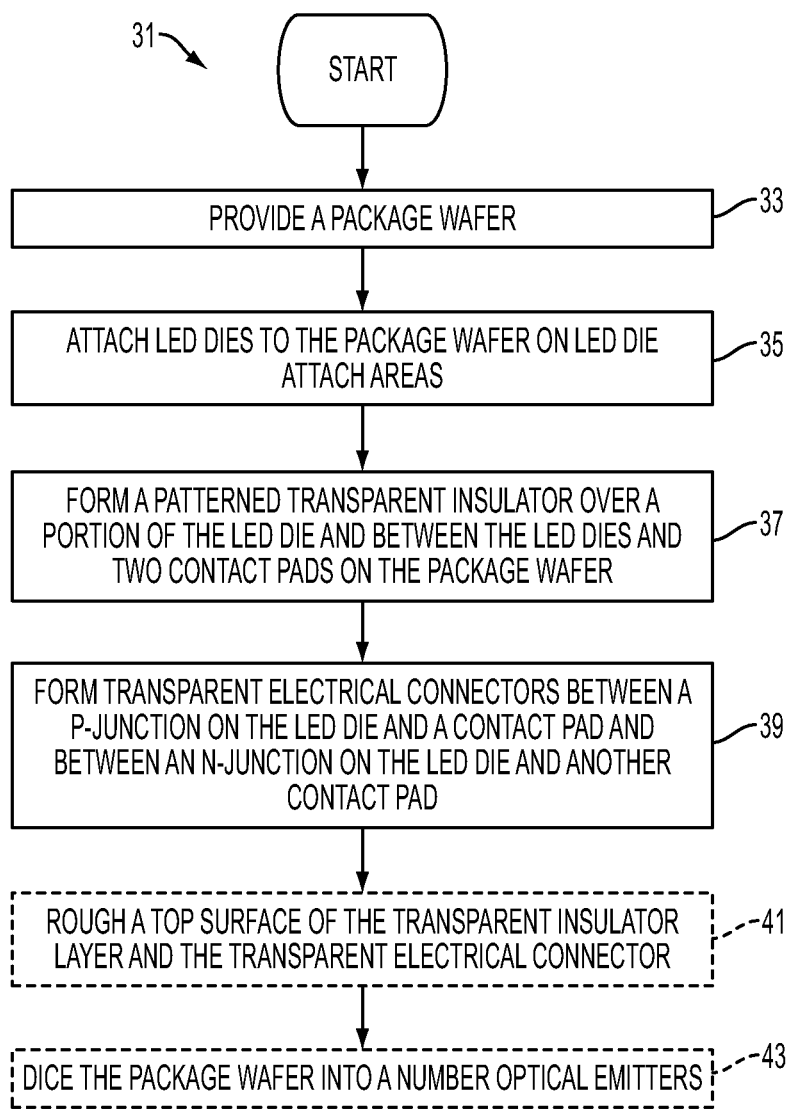
FIG. 4 is a flowchart illustrating a method of fabricating an optical emitter according to another embodiment of the present disclosure.
Figure 6A:
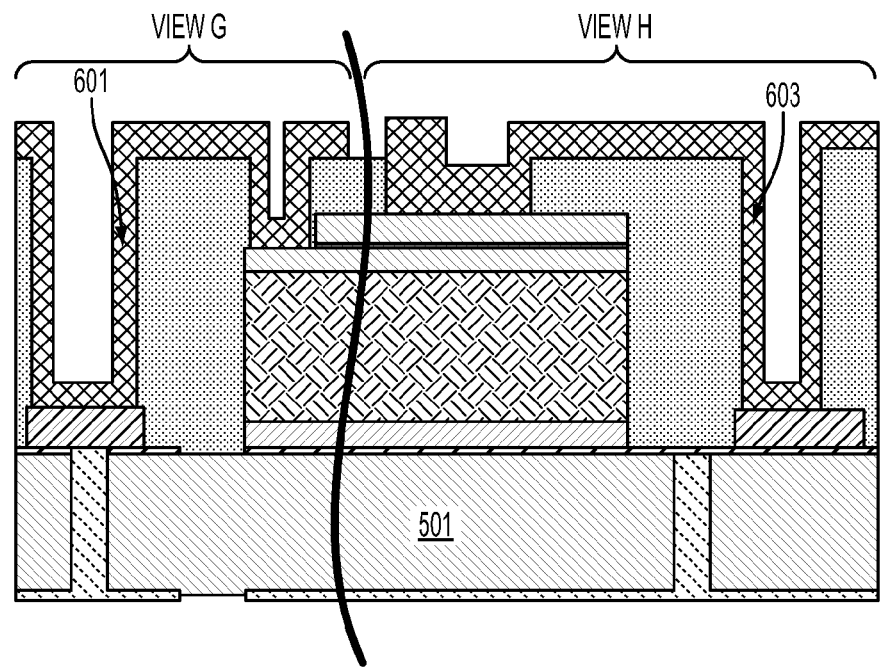
Figure 6B:
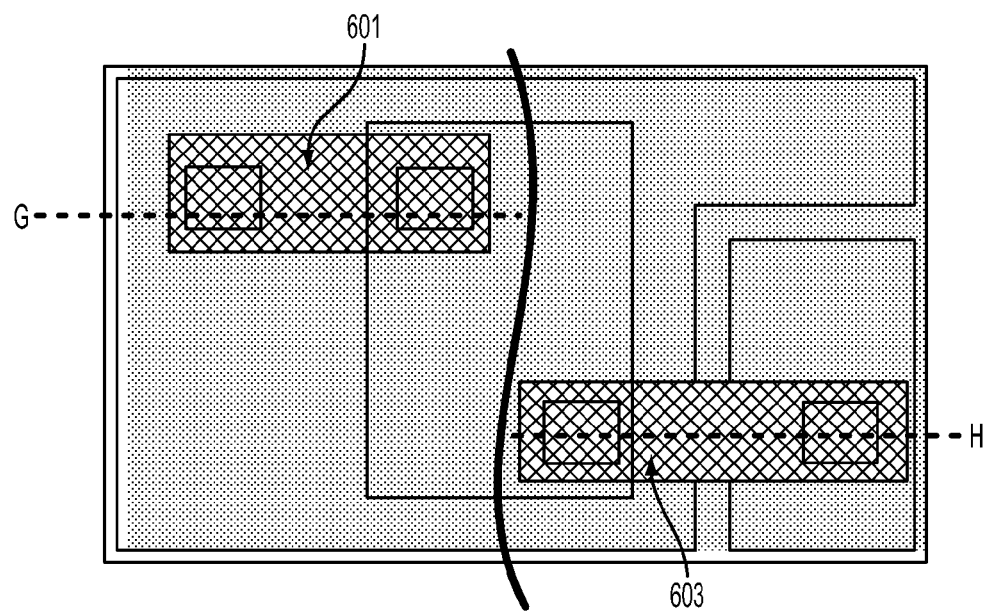
Figure 7:
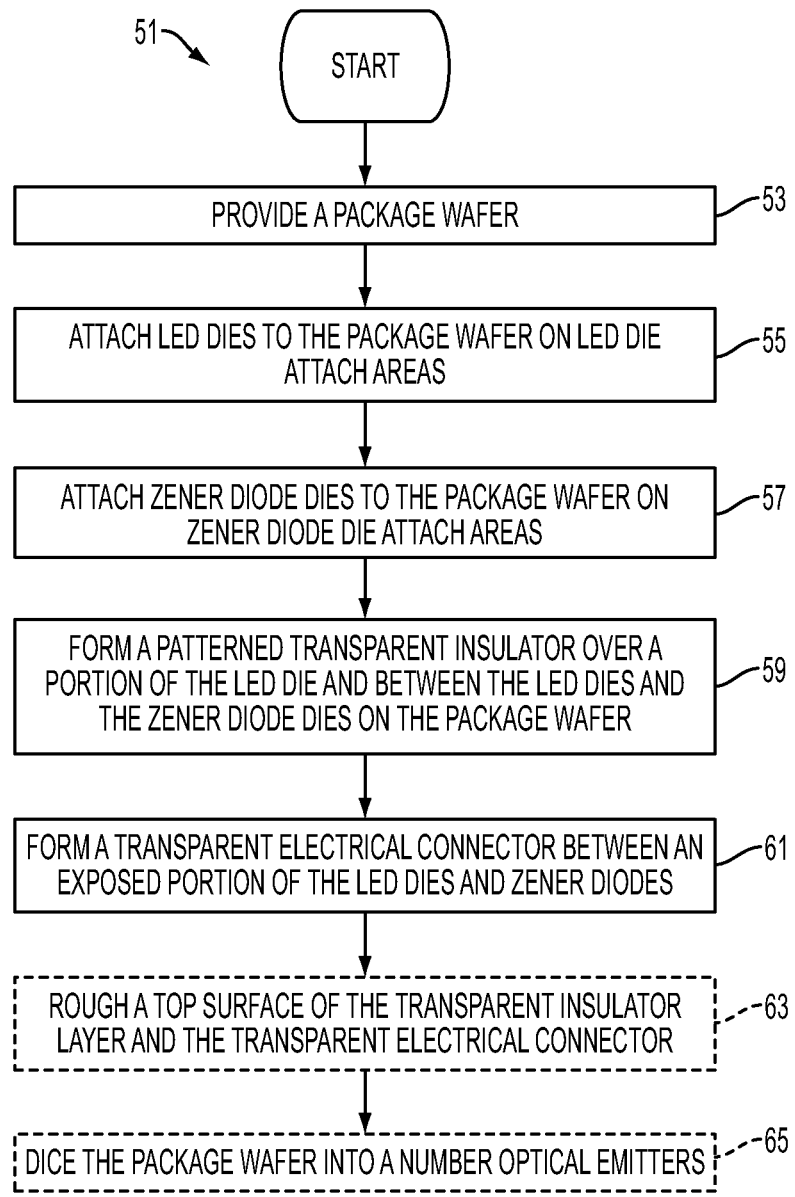
FIG. 7 is a flowchart illustrating a method of fabricating an optical emitter according to another embodiment of the present disclosure; and, FIGS. 8A and 8B include a side view and a top view of a partially fabricated optical emitter according to another embodiment of the present disclosure.

Illustrated in FIGS. 1, 4, and 7 are flowcharts of methods 11, 31, and 51 of fabricating optical emitters using a wafer level packaging process in accordance with the present disclosure. Corresponding to the flowcharts are diagrammatic fragmentary top and side views of an optical emitter during various fabrication stages in FIGS. 2A-3B, 5A-6B, and 8A-8B, respectively.

Referring to FIG. 1, the method 11 describes various embodiments of packaging optical emitters having a vertical LED die. The method 11 begins with operation 13 in which a package wafer is provided. A package wafer may be a silicon wafer, a silicon carbide wafer, or a glass. In wafer level packaging of LED dies, many LED dies are packaged onto a single package wafer at the same time. The package wafer includes many optical emitter package portions, each package portion includes at least one LED die attach area and one contact pad. Thus a package wafer includes many LED die attach areas and many contact pads, each contact pad associated with an LED die attach area. Each package portion may also include a Zener diode die attach area, another contact pad, and circuitry either on the package wafer or embedded into the package wafer. The circuitry may include conductor and/or dielectric patterns (including pads, trenches, and vias), and through vias filled or partially filled with conductive material. The package wafer may also include scribe lines, alignment marks, and other features designed for the optical emitter packaging process. For packaging a vertical LED die, the package portion on the package wafer usually includes only one contact pad.

In operation 15, LED dies are attached to the package wafer on LED die attach areas. An LED die includes a light-emitting structure that has two doped layers and a multiple quantum well (MQW) layer, also referred to as the active layer, between the doped layers. The doped layers are oppositely doped semiconductor layers. In some embodiments, a first doped layer includes an n-type gallium nitride material, and the second doped layer includes a p-type material. In other embodiments, the first doped layer includes a p-type gallium nitride material, and the second doped layer includes an n-type gallium nitride material. The MQW layer includes alternating (or periodic) layers of active materials including, for example, gallium nitride and indium gallium nitride. For example, in at least one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth.

The doped layers and the MQW layer are all formed by epitaxial growth processes on a growth substrate, which may be made of silicon, silicon carbide, gallium nitride, or sapphire. After the completion of the epitaxial growth processes, a p-n junction (or a p-n diode) is essentially formed. When an electrical voltage is applied between the doped layers, an electrical current flows through the light-emitting structure, and the MQW layer emits light. The color of the light emitted by the MQW layer is associated with the wavelength of the emitted radiation, which may be tuned by varying the composition and structure of the materials that make up the MQW layer. The light-emitting structure may optionally include additional layers such as a buffer layer between the growth substrate and the first doped layer, a reflective layer, and an ohmic contact layer. A suitable buffer layer may be made of an undoped material of the first doped layer or other similar material. A light-reflecting layer may be a metal, such as aluminum, copper, titanium, silver, silver, alloys of these, or combinations thereof. An ohmic contact layer may be an indium tin oxide (ITO) layer. The light reflecting layer and ohmic contact layer may be formed by a physical vapor deposition (PVD) process or a chemical vapor deposition (CVD) or other deposition processes.

Figure 2A:
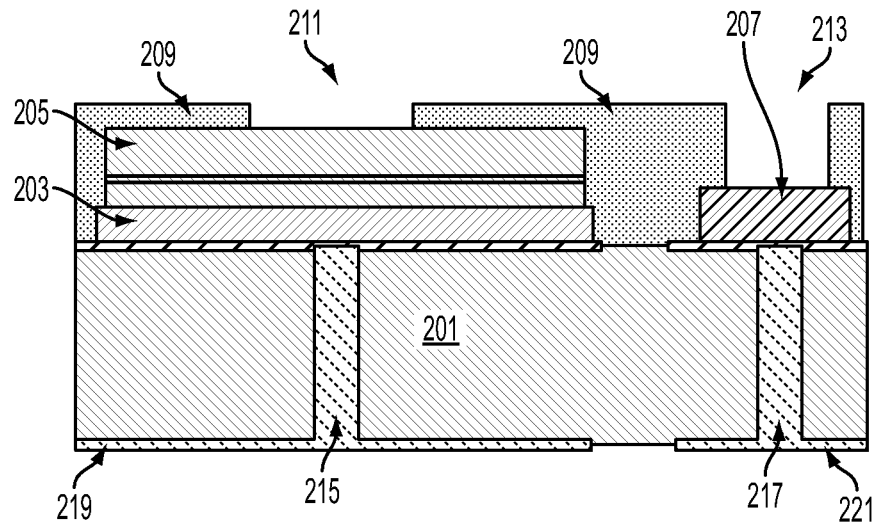
FIGS. 2A-3B are side views and corresponding top views of a partially fabricated optical emitter at various stages of fabrication according to an embodiment of the present disclosure.
Figure 2B:
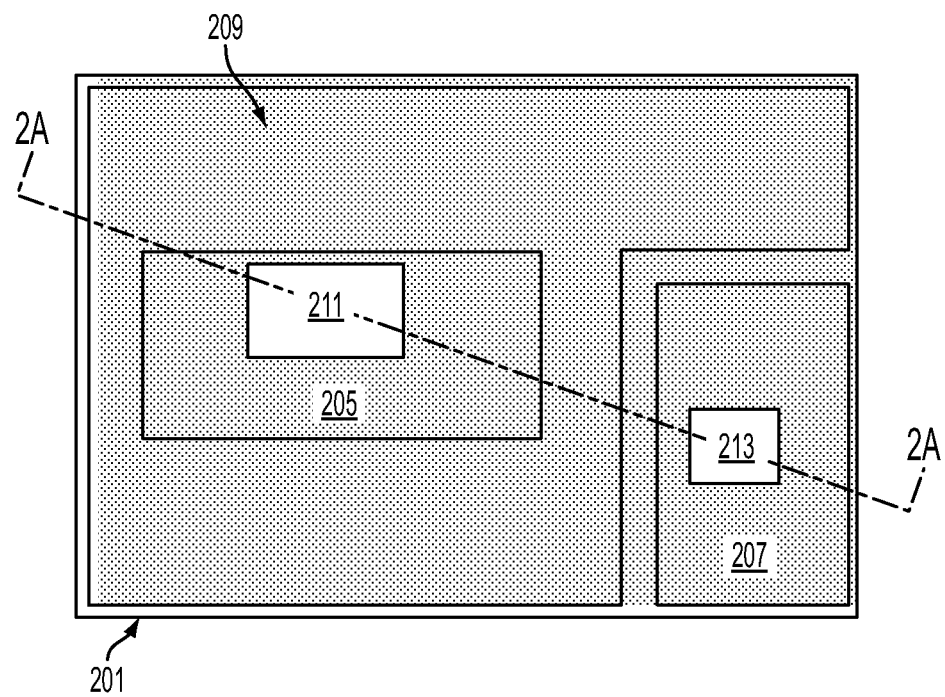

In operation 17, a patterned transparent insulator is formed over a portion of the LED die and between the LED dies and a contact pad on the package wafer. FIGS. 2A and 2B illustrate a side view and a top view of a package wafer 201, LED die attach area 203, vertical LED die 205, a contact pad 207, and a patterned transparent insulator 209. The cross section lien for the side view of FIG. 2A is indicated on FIG. 2B as View 2A. The patterned transparent insulator has openings 211 and 213 over the LED die 205 and the contact pad 207 respectively. FIG. 2A also shows optional through substrate vias (TSVs) 215 and 217. TSVs 215 and 217 are filled with a conductor. TSV 215 connects the LED die attach area 203 to a terminal 219 on the backside of the package wafer 201. TSV 217 connects the contact pad 207 to a terminal 221 on the backside of the package wafer 201. Note that the TSVs are optional. The optical emitter may be formed with alternate conductors between the contact pad/LED die attach area and the terminals, for example embedded wiring.

The transparent insulator may be formed by a sequence of processes of depositing a transparent insulator layer, patterning the transparent insulator layer using photolithography methods, and etching the transparent insulator layer to create an opening over the LED die and the at least one contact pad. A transparent insulator layer may be deposited using techniques such as spin-coating, spray-coating, dispensing, molding, dipping, or screen-printing. The transparent insulator layer covers the entire surface of the LED die 205, contact pad 207 and surrounding the LED die 205 and the contact pad 207. Transparent insulator layer may include a silicone, an epoxy, or a polyimide that do not conduct electricity. The transparent insulator layer may not be completely transparent, or allow 100% of the light generated by the LED to pass through; however, the transparent insulator layer has a high optical transparency in the visible wavelengths, at least greater than about 90%, 95%, or 98%.

The transparent insulator layer may be patterned using photolithography methods. In one example, a photoresist layer is deposited over the transparent insulator layer and a portion of the photoresist layer is exposed to light. The photoresist layer is then developed to remove portions of the photoresist over the LED die 205 and over the contact pad 207 to form openings above areas where openings 211 and 213 will be formed, respectively.

The photoresist is then used as an etch mask to allow removal of the transparent insulator layer to form the openings 211 and 213, resulting in the partially fabricated optical emitter as shown in FIGS. 2A and 2B. Although the opening 211 depicted in FIG. 2A/2B only expose a portion of the LED die 205 and opening 213 depicted in FIG. 2A/2B only expose a portion of the contact pad 207, the openings 211 and 213 may be larger or smaller.

In some embodiments, the openings 211 and 213 may be patterned to allow better electrical conduction. For example, opening 211 may include fingers radiating out of a center portion, or be several interconnected openings. The use of photolithographic methods to form openings 211 and 213 allow a wide variety of shapes and sizes to be implemented. The etching process may be a wet etch or a dry etch depending on the type of photoresist and transparent insulator layer material used. The etchant is selected to preferentially remove transparent insulator layer material as opposed to the etch mask material. After the openings 211 and 213 are etched to exposed the underlying LED die 205 and contact pad 207, the etch mask is removed in a stripping operation, resulting in patterned transparent insulator 209.

The patterned transparent insulator may 209 also be formed using a screen printing process. Screens having desired transparent insulator patterns are provided. The screen may be the same size as a package wafer and can form patterned transparent insulator in one operation for all optical emitters packaged on the same package wafer. In screen printing, the screen is placed over the package wafer having LED die and a contact pad attached/formed. The screen may be clamped to the package wafer. A predetermined amount of transparent insulator material is then dispensed in a portion of the screen. A blade or wiper then moves across the screen to spread the transparent insulator material for forming a uniform coating. The blade or wiper may make several passes with or without adding transparent insulator material. After the transparent insulator is formed, the screen is removed from the package wafer, resulting in the partially fabricated optical emitter similar to that shown in FIGS. 2A and 2B.

One difference between a transparent insulator formed using photolithographic methods and screen printing methods is the available shapes of openings 211 and 213. A screen may include a border around each optical emitter package portion, but the stencil for the openings 211 and 213 must be connected to the border. Thus openings 211 and 213 are either placed along the border of the optical emitter package portion or include elongate portions that connect the openings to the border. Further, screen printing is limited in the size of the patterns in the transparent insulator, usually no smaller than the order of several hundred micrometers. Photolithographic techniques can be used to form very small patterns, on the order of several nanometers. However, photolithographic techniques require more processing steps and cost more, both in equipment and material, while the unused transparent insulator material after screen printing may be recycled. Thus one skilled in the art may choose one method over another depending on the size of optical emitter package and transparent insulator pattern required.

The transparent insulator 209 isolates a transparent electrical connector from short-circuiting across the LED die. Thus the transparent insulator is deposited at least in the portion of the optical emitter package between the LED die and the contact pad. Particularly, the sidewalls of the LED die are isolated to force all current across the p-n junction.

Referring back to FIG. 1, in operation 19 a transparent electrical connector is formed. The transparent electrical connector connects a portion of the LED dies not covered by the transparent insulator (through the opening 211) and a contact pad at opening 213. FIGS. 3A and 3B depict a side view and a corresponding top of a partially fabricated optical emitter with a transparent electrical connector 315 in accordance with some embodiments. The side view of FIG. 3A shows the cross section at View 3A of FIG. 3B. As shown, transparent electrical connector 315 covers the entire optical emitter package portion over the transparent insulator and the openings 211 and 213. Because the underlying transparent insulator isolates LED die, the transparent electrical connector 315 can be deposited in one operation without patterning.

The transparent electrical connector 315 is highly conductive and optically transmissive in the visible wavelengths. While complete transparency is not required, the transparent electrical connector 315 allows most of the light to pass through, at least greater than about 90%, 95%, or 98%. Suitable material includes inorganic and organic materials. Example inorganic materials include indium tin oxide (ITO), any other transparent conductive metal oxides, or inorganic conductive glue. Example organic materials include epoxy, resin, polyimide, or other polymer that further includes a conductive additive such as metal particles or carbon particles. In one example, the conductive glue is an epoxy with fine silver particle additives. As the conductive glue dries, the silver particles form a conductive network. The concentration and type of conductive particles in the glue and thickness of the deposited conductive glue layer affects the conductivity of the electrical connector. For optical emitters containing high power LEDs, conductive glue with sufficient conductivity should be chosen to avoid reliability problems.

The transparent electrical connector 315 of FIGS. 3A and 3B is an unpatterned transparent conductive layer. Because the LED die is connected to only one contact pad, only one electrical connector is used, which can be an entire layer. A transparent conductive layer may be deposited using known techniques such as physical vapor deposition (PVD), chemical vapor deposition (CVD), spin-coating, spray-coating, dispensing, molding, dipping, and screen-printing. Other embodiments involve multiple transparent electrical connectors formed using other methods as discussed below.

Referring back to FIG. 1, a top surface of the transparent insulator layer and the transparent electrical connector may be optionally made rough in operation 21 after the transparent electrical connector is made. A rough surface improves light extraction because total internal reflection is less likely with many faceted surfaces. The roughing may be performed by exposing the package wafer to plasma etching, wet etching, or depositing small transparent particles on the top surface.

Next, the optical emitter packaging may further include the addition of a number of optional components added onto the package wafer. One or more layers of phosphor may be added to the package to change the emitted light wavelength. One or more layers of encapsulant or lens may be formed over the LED die. Side reflectors may also be added for each optical emitter to redirect side light emissions. Some of these additional components may be formed in combination. For example, the phosphor material may be a part of the lens or be coated onto the lens. Some of these additional components may be omitted. For example, side reflectors may not be needed for optical emitters containing certain vertical LEDs.

After optical emitter packaging is completed on the package wafer, the package wafer is optionally diced into a number of optical emitters in operation 23 along boundaries of optical emitter package portions. The package wafer may be cut through transparent insulator layers and transparent conductive layers by a saw or laser.

The optical emitter with vertical LED described in association with FIGS. 1-3B has improved light output as compared to conventional optical emitters because no opaque material such as metal wires and electrodes are placed in the output light path. The resulting optical emitter is robust because no flexible wires are used and can withstand mechanical pressure better in subsequent processing. The fabrication process is relatively simple and requires only uncomplicated process tools, for example, screen printer and spin coater. The transparent electrical connector being an entire transparent conductive layer ensures a better electrical connection than point-to-point wire bonding. In some embodiments such as high-end optical emitters, complicated patterns for electrical connectors are formed by using photolithographic processes. One or more of these features apply to embodiments of the present disclosure.

Figure 5A:
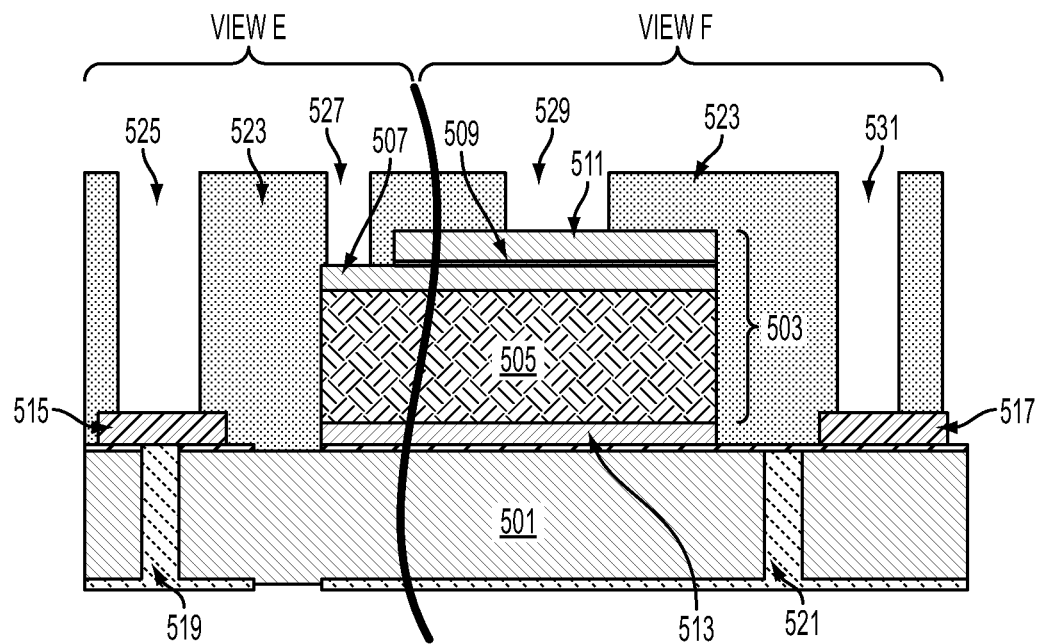
FIGS. 5A-6B are side views and corresponding top views of a partially fabricated optical emitter at various stages of fabrication according to another embodiment of the present disclosure.
Figure 5B:
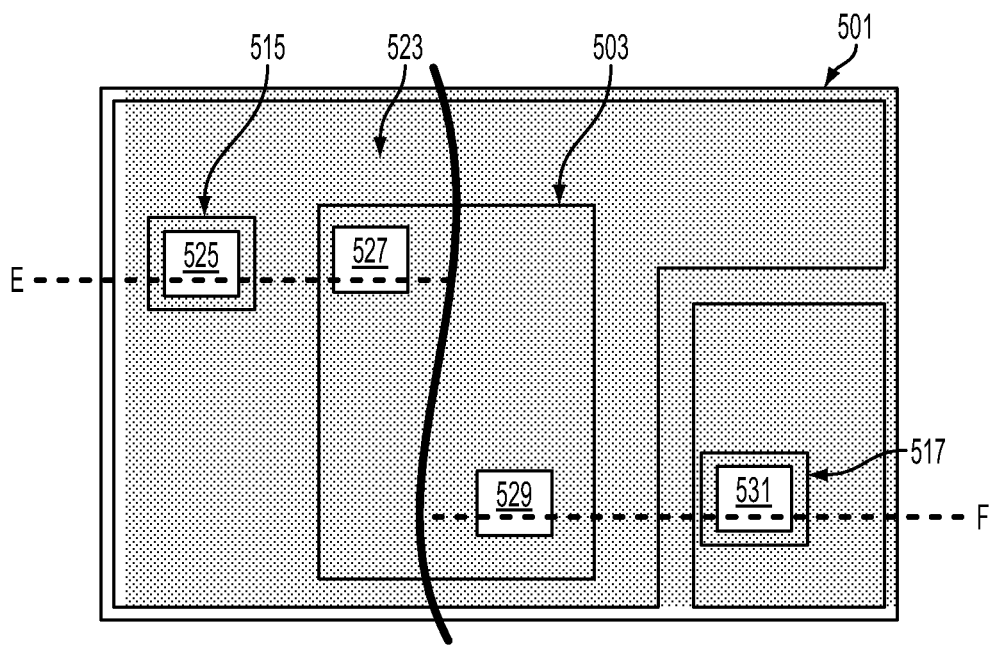

FIG. 4 is a flowchart of an optical emitter with horizontal LED in accordance with various embodiments of the present disclosure. FIGS. 5A and 6A are side views of an optical emitter at various fabrication stages according to some embodiments, and FIGS. 5B and 6B are top views corresponding to FIGS. 5A and 6A, respectively. The remaining discussion focuses on the differences from embodiments depicted in FIGS. 1-3B, and similar details are not repeated. FIG. 5A shows a horizontal LED die 503 including the growth substrate 505, a first doped layer 507 above the growth substrate 505, multiple quantum wells (MQWs) 509 on the first doped layer 507, and a second doped layer 511 formed on the MQWs 509. The second doped layer 511 is oppositely doped from the first doped layer 507. FIG. 5A shows the side view from two separation sections of FIG. 5B as shown.

The method 31 illustrated in FIG. 4 includes some process operations similar to that of FIG. 1. In operation 33, a package wafer is provided. As shown in FIG. 5A, the package wafer 501 includes an LED attachment area 513, contact pads 515 and 517 for electrically connecting to the first doped layer 507 and second doped layer 511, respectively, and through substrate vias (TSVs) 519 and 521 filled at least partially with a conductor, which electrically connects the front side of the package wafer 501 to terminals on the backside of the package wafer. Similar to the package wafer 201 of FIG. 2, the TSVs shown in FIG. 5A are not required in some embodiments.

Referring to FIG. 4, in operation 35, LED dies are attached to the package wafer on the LED die attach area. Referring to FIGS. 5A and 5B, the LED die 503 is attached to package wafer 501 on an LED die attach area 513. In these embodiments, the attachment of the LED die 503 to the package wafer 501 is a non-conductive connection because the sapphire substrate 505 is non-conductive. In some embodiments, the sapphire substrate is removed prior to attaching the LED die, and the LED die does not include the sapphire substrate 505. In the embodiments without a sapphire substrate, the attachment to the package wafer 501 is non-conductive.

In operation 37, a patterned transparent insulator is formed over a portion of the LED die and between the LED dies and two contact pads on the package wafer. Referring to FIGS. 5A and 5B, the patterned transparent insulator 523 includes various openings 525, 527, 529, and 531 for subsequent formation of transparent electrical connectors. The patterned transparent insulator 523 and openings 525, 527, 529, and 531 are formed substantially the same as the formation of patterned transparent insulator 209 and openings as discussed above in association with FIGS. 1 and 2A/2B.

Referring back to FIG. 4, in operation 49 transparent electrical connectors are formed. The transparent electrical connectors connect a portion of the LED dies without the transparent insulator (openings 527 and 529) and contact pads at openings 525 and 531, respectively. The transparent electrical connector may be formed by a sequence of processes of depositing a transparent conductive layer, patterning the transparent conductive layer using photolithography methods, and etching the transparent conductive layer to create one or more electrical connectors over the LED die and the at least one contact pad. A transparent conductive layer may be deposited using known techniques such as physical vapor deposition (PVD), chemical vapor deposition (CVD), spin-coating, spray-coating, dispensing, molding, dipping, and screen-printing. Because there are two separate transparent electrical connectors 601 and 603, the transparent conductive layer is patterned. The transparent conductive layer may be patterned using photolithography methods. In one example, a photoresist layer is deposited over the transparent conductive layer and a portion of the photoresist layer is exposed to light. The photoresist layer is then developed to expose portions of the transparent conductive layer that would make a short circuit around the LED die. The remaining photoresist then acts as an etch mask in a subsequent etching process where the exposed portions of the transparent conductive layer is removed. The etching process may be a wet etch or a dry etch, depending on the material used as the transparent conductive layer. After the etch is completed, the remaining photoresist may be removed in a stripping process. While FIG. 6B shows that transparent electrical connectors 601 and 603 occupy a small area comparing to the transparent insulator, the transparent electrical connectors 601 and 603 can be of any shape and area as long as the two electrical connectors 601 and 603 are electrically isolated from each other.

The patterned transparent electrical connectors may also be formed using a screen printing process. Screens having desired transparent electrical connector patterns are provided. The screen may be the same size as a package wafer and can form patterned translator electrical connector in one operation for all optical emitters packaged on the same package wafer. The screen printing operation is similar to that described above in association with screen printing a transparent insulator in association with operation 17 of FIG. 1.

The remaining optional operations 41 and 43 are the same as operations 21 and 23 of FIG. 1 describe above and are not repeated.

Figure 8A:
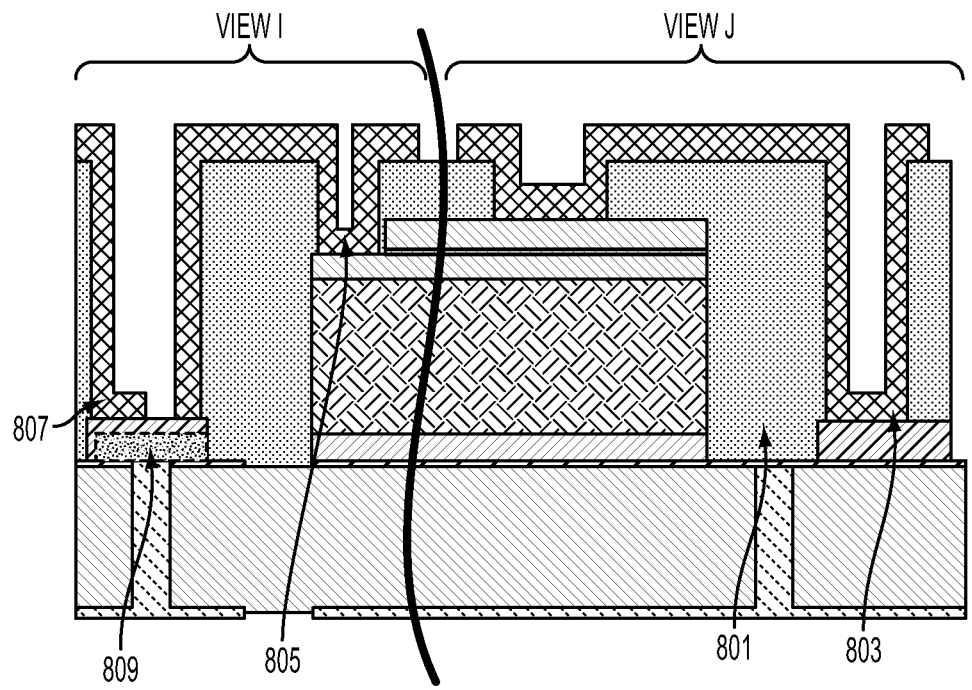
Figure 8B:
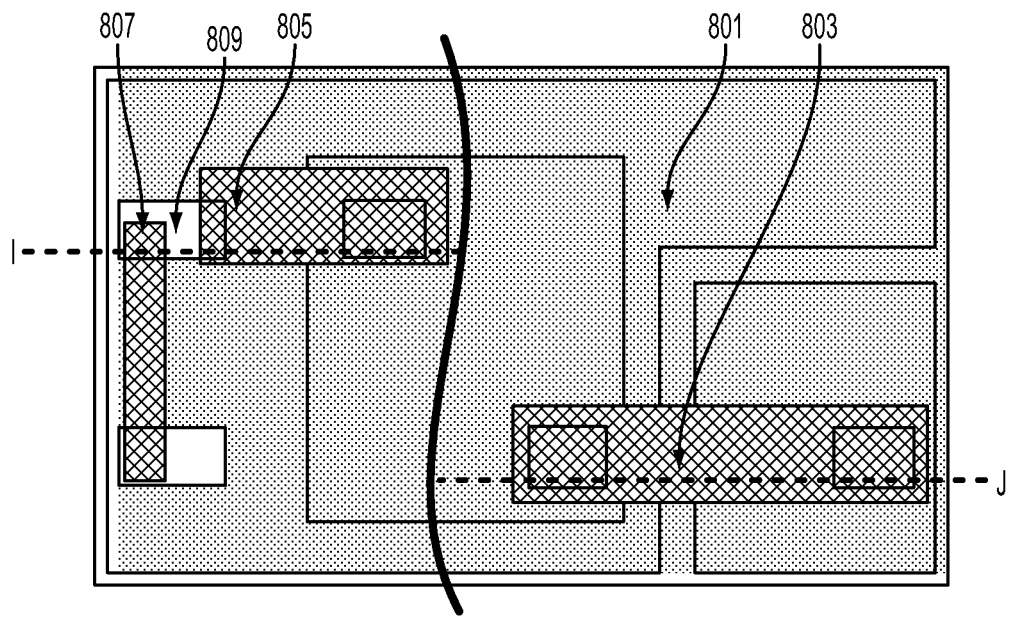

FIG. 7 is a flowchart of fabricating an optical emitter with a Zener diode die in accordance with various embodiments of the present disclosure. FIGS. 8A and 8B depict a side view and a corresponding top view of a partially fabricated optical emitter in accordance with some embodiments. FIG. 8A shows the side view from two separation sections of FIG. 8B as shown. In these embodiments, the LED die is packaged with an electro-static discharge (ESD) and/or electrical fast transient (EFT) protection circuit such as a Zener diode die. In some embodiments, other commonly used ESD and EFT protection devices are used, such as a transient suppression diode and a multilayer varistor. When packaged in close proximity to the LED die, the wiring connections for ESD and EFT protection circuitries become a part of the optic system, often blocking or shielding the light. Thus in these embodiments, a transparent electrical connector electrically connects the Zener diode die to the LED die and the electrical connector between a contact pad on the package wafer and the Zener diode die may be another transparent electrical connector or an embedded metal connector on or in the package wafer.

The operations in the process flow of FIG. 7 are similar to the operations in the process flow of FIGS. 1 and 4 with the exception of additionally attaching Zener diode dies to the package wafer on Zener diode die attach areas in operation 57, forming a patterned transparent insulator between the LED dies and the Zener diode dies in operation 59, and forming a transparent electrical connector between an exposed portion of the LED dies and Zener diode dies in operation 61.

FIGS. 8A and 8B illustrate one embodiment of the transparent insulator 801 and transparent electrical connectors 803, 805, and 807 for an optical emitter with a Zener diode die. The transparent insulator 801 and transparent electrical connectors 803, 805, and 807 are formed with processes as explained above but with different patterns to allow the additional electrical connector for the Zener diode 809.

Note that while transparent insulators and electrical connectors are illustrated with right-angled corners and uniform thicknesses, in practice the various processing may result in various types of configurations for the transparent insulators and electrical connectors, e.g., less defined corners and different thicknesses. For example, the openings 211 and 213 may be completely filled by the transparent electrical connector 315 instead of being conformally coated as shown in FIG. 3A.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. For example, additional transparent electrical connectors may be formed to connect additional circuitry, (i.e., driver, controller, IC chip) to the LED die. In other examples, a network of transparent electrical connectors may connect multiple LEDs on one optical emitter. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An optical emitter comprising:
    a package wafer having a Light-Emitting Diode (LED) die attach area and at least one contact pad;
    a Light-Emitting Diode (LED) die attached to the package wafer at the die attach area;
    a transparent insulator disposed over a selected portion of an upper surface of the LED die and between the LED die and the at least one contact pad, wherein the selected portion of the upper surface of the LED die is less than an entire upper surface of the LED die, and wherein the transparent insulator circumferentially surrounds the LED die in a top view; and
    at least one transparent electrical connector connecting the LED die and the at least one contact pad.

2. The optical emitter of claim 1, wherein no metal conductor is disposed over the LED die.

3. The optical emitter of claim 1, wherein the LED die is a horizontal LED die and the package wafer has two contact pads.

4. The optical emitter of claim 3, wherein the at least one transparent electrical connector is two transparent electrical connectors.

5. The optical emitter of claim 1, wherein the LED die is a vertical LED die and the package wafer has one contact pad and wherein the die attach area comprise a conductor.

6. The optical emitter of claim 1, wherein the transparent insulator comprises a silicone, an epoxy, or a polyimide.

7. The optical emitter of claim 1, wherein the at least one transparent electrical connector comprises indium tin oxide (ITO) or a conductive glue.

8. The optical emitter of claim 7, wherein the conductive glue comprises a metallic conductive additive or carbon.

9. The optical emitter of claim 7, wherein the conductive glue is an organic polymer.

10. The optical emitter of claim 1, wherein the package wafer includes at least one through wafer via filled with a conductor connecting the at least one contact pad to a terminal on a backside of the package wafer.

11. An optical emitter comprising:
a package wafer having a Light-Emitting Diode (LED) die attach area, a circuit protection die attach area, and at least one contact pad;
a Light-Emitting Diode (LED) die attached to the package wafer at the LED die attach area;
a circuit protection die attached to the package wafer at the circuit protection die attach area;
a transparent insulator over at least a portion of the LED die and between the LED die and the at least one contact pad and between the LED die and the circuit protection die; and,
a transparent electrical connector connecting the LED die and the circuit protection die.

12. The optical emitter of claim 11, wherein the circuit protection die is a Zener diode die.

13. An optical emitter, comprising:
a package substrate;
a Light-Emitting Diode (LED) disposed over the package substrate, wherein the LED includes a first doped layer, a second doped layer, and an active layer disposed between the first doped layer and the second doped layer,
a transparent insulating material disposed over the LED, the transparent insulating material containing an opening that exposes a portion of the first doped layer, wherein the transparent insulating material circumferentially surrounds the LED in a top view; and
a transparent conductive material disposed over the transparent insulating material, wherein the opening is filled by the transparent conductive material.

14. The optical emitter of claim 13, wherein the LED is a vertical LED.

15. The optical emitter of claim 14, wherein the transparent conductive material is a single continuous layer.

16. The optical emitter of claim 14, further comprising a through-substrate-via (TSV) that extends vertically through the package substrate, wherein the TSV is electrically coupled to the second doped layer.

17. The optical emitter of claim 16, wherein the TSV is disposed below the LED.

18. The optical emitter of claim 13, wherein the LED is a horizontal LED.

19. The optical emitter of claim 18, wherein the transparent conductive material includes a plurality of non-contiguous segments.

20. The optical emitter of claim 18, wherein the insulating material contains a further opening that exposes a portion of the second doped layer.

21. The optical emitter of claim 18, further comprising a sapphire substrate that is disposed between the LED and the package substrate.

22. The optical emitter of claim 13, wherein:
the transparent insulating material contains silicone, epoxy, or polyimide; and
the transparent conductive material contains indium tin oxide (ITO) or a conductive glue.

* * * * *